(12) United States Patent
Edwards et al.

(10) Patent No.: US 9,754,930 B2
(45) Date of Patent: Sep. 5, 2017

(54) ESD PROTECTION DEVICE WITH IMPROVED BIPOLAR GAIN USING CUTOUT IN THE BODY WELL

(71) Applicant: Texas Instruments Incorporated, Dallas, TX (US)

(72) Inventors: Henry Litzmann Edwards, Garland, TX (US); Akram A. Salman, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/292,409

(22) Filed: Oct. 13, 2016

(65) Prior Publication Data

US 2017/0033096 A1    Feb. 2, 2017

Related U.S. Application Data

(62) Division of application No. 15/042,233, filed on Feb. 12, 2016, now Pat. No. 9,496,252, which is a division
(Continued)

(51) Int. Cl.
*H01L 27/02*      (2006.01)
*H01L 27/092*     (2006.01)
*H01L 21/8238*    (2006.01)
*H01L 21/265*     (2006.01)
*H01L 21/266*     (2006.01)
(Continued)

(52) U.S. Cl.
CPC ........ *H01L 27/0262* (2013.01); *H01L 21/266* (2013.01); *H01L 21/26513* (2013.01); *H01L 21/823892* (2013.01); *H01L 23/5283* (2013.01); *H01L 27/092* (2013.01); *H01L 27/0928* (2013.01); *H01L 29/66371* (2013.01); *H01L 29/742* (2013.01)

(58) Field of Classification Search
CPC ......... H01L 21/823456; H01L 27/0248; H01L 27/0292
See application file for complete search history.

(56) References Cited

U.S. PATENT DOCUMENTS 5,242,841 A    9/1993  Smayling et al.
5,550,067 A *  8/1996  Kuroyanagi .... H01L 21/823456
                                              257/E21.624
(Continued)

*Primary Examiner* — Kenneth Parker
*Assistant Examiner* — Fang-Xing Jiang
(74) *Attorney, Agent, or Firm* — Jacqueline J. Garner; Charles A. Brill; Frank D. Cimino

(57) ABSTRACT

An integrated circuit includes an NMOS SCR in which a p-type body well of the NMOS transistor provides a base layer for a vertical NPN layer stack. The base layer is formed by implanting p-type dopants using an implant mask which has a cutout mask element over the base area, so as to block the p-type dopants from the base area. The base layer is implanted concurrently with p-type body wells under NMOS transistors in logic components in the integrated circuit. Subsequent anneals cause the p-type dopants to diffuse into the base area, forming a base with a lower doping density that adjacent regions of the body well of the NMOS transistor in the NMOS SCR. The NMOS SCR may have a symmetric transistor, a drain extended transistor, or may be a bidirectional NMOS SCR with a symmetric transistor integrated with a drain extended transistor.

3 Claims, 9 Drawing Sheets

Related U.S. Application Data of application No. 13/594,106, filed on Aug. 24, 2012, now Pat. No. 9,293,460.

(51) Int. Cl.
  *H01L 29/66* (2006.01)
  *H01L 29/74* (2006.01)
  *H01L 23/528* (2006.01)

(56) References Cited

U.S. PATENT DOCUMENTS

| | | | | |
|---|---|---|---|---|
| 5,563,437 | A | * 10/1996 | Davies | H01L 27/0248 |
| | | | | 257/329 |
| 5,869,372 | A | 2/1999 | Fujihira et al. | |
| 5,940,700 | A | 8/1999 | Galbiati et al. | |
| 5,959,820 | A | * 9/1999 | Ker | H01L 27/0248 |
| | | | | 361/111 |
| 6,144,542 | A | * 11/2000 | Ker | H01L 27/0292 |
| | | | | 361/111 |
| 6,671,153 | B1 | * 12/2003 | Ker | H01L 27/0262 |
| | | | | 361/111 |
| 2002/0109190 | A1 | 8/2002 | Ker et al. | |
| 2005/0270710 | A1 | 12/2005 | Ker et al. | |
| 2006/0097321 | A1 | 5/2006 | Kim | |

\* cited by examiner

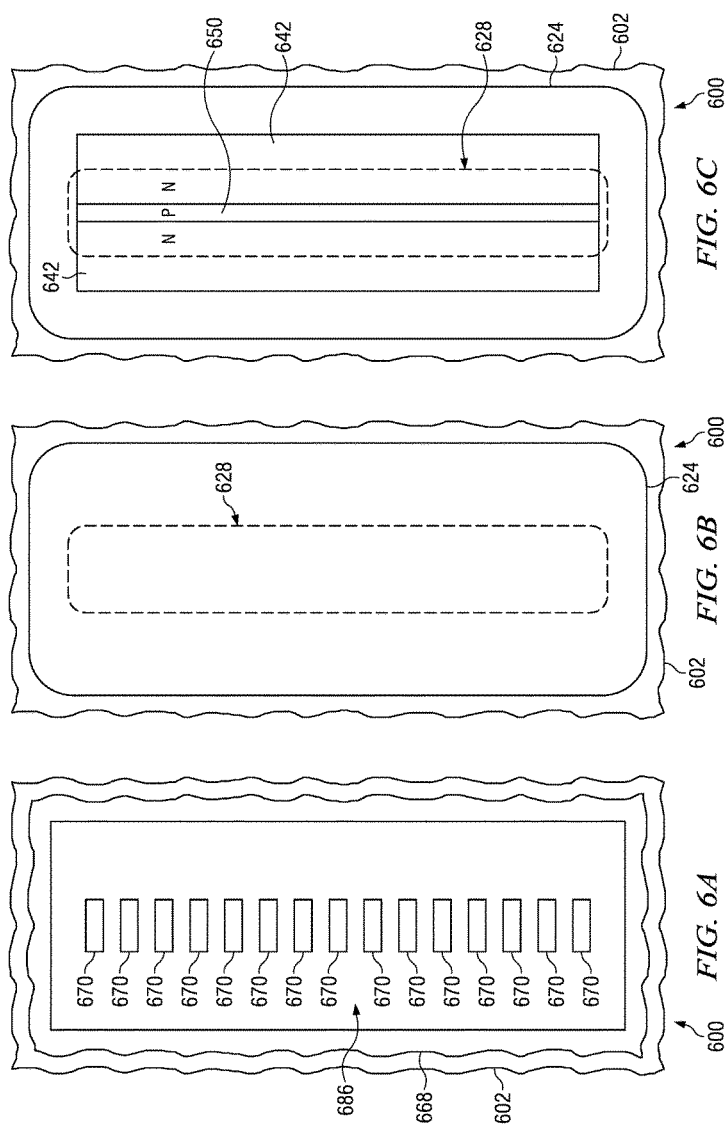

ESD PROTECTION DEVICE WITH IMPROVED BIPOLAR GAIN USING CUTOUT IN THE BODY WELL

CROSS REFERENCE TO RELATED APPLICATIONS

This application is a divisional of U.S. Nonprovisional patent application Ser. No. 15/042,233, filed Feb. 12, 2016, which is a divisional of U.S. Nonprovisional patent application Ser. No. 13/594,106, filed Aug. 24, 2012 (now U.S. Pat. No. 9,293,460), the contents of both of which are herein incorporated by reference in its entirety.

FIELD OF THE INVENTION

This invention relates to the field of integrated circuits. More particularly, this invention relates to silicon controlled rectifiers (SCRs) in integrated circuits.

BACKGROUND OF THE INVENTION

An integrated circuit may include a silicon controlled rectifier (SCR) having a vertical stack of an n-type heavily doped layer, a p-type well layer and an n-type deep well layer. The SCR may be, for example, part of an electrostatic discharge (ESD) protection circuit. A bipolar gain of the vertical stack is controlled by a doping density and thickness of the p-type well layer. The p-type well layer may be formed concurrently with other p-type well layers in the integrated circuit, for example p-type well layers under n-channel metal oxide semiconductor (NMOS) transistors. Forming the p-type layers to simultaneously provide a desired bipolar gain in the SCR and provide a desired level of off-state current in the NMOS transistors may be problematic.

SUMMARY OF THE INVENTION

An integrated circuit may include an NMOS SCR in which a p-type body well of the NMOS transistor provides a p-type layer for an SCR. The p-type body well is formed by implanting p-type dopants using an implant mask which has a cutout segment, so as to block the p-type dopants from a cutout in the p-type body well under an n-type source region and a p-type body contact region. The p-type body well is implanted concurrently with p-type body wells under NMOS transistors in logic components in the integrated circuit. Subsequent anneals cause the p-type dopants to diffuse into the cutout, forming a cutout with a lower doping density than regions of the body well outside the cutout. The NMOS transistor in the NMOS SCR may be a symmetric transistor, or may be a drain extended transistor. A bidirectional NMOS SCR may be formed which includes two integrated NMOS SCRs, for example a symmetric transistor integrated with a drain extended transistor.

DESCRIPTION OF THE VIEWS OF THE DRAWING

FIG. 6A through FIG. 6C are top views of integrated circuits depicting successive stages of formation of a cutout in a body well.

DETAILED DESCRIPTION OF EXAMPLE EMBODIMENTS

Figure 1:
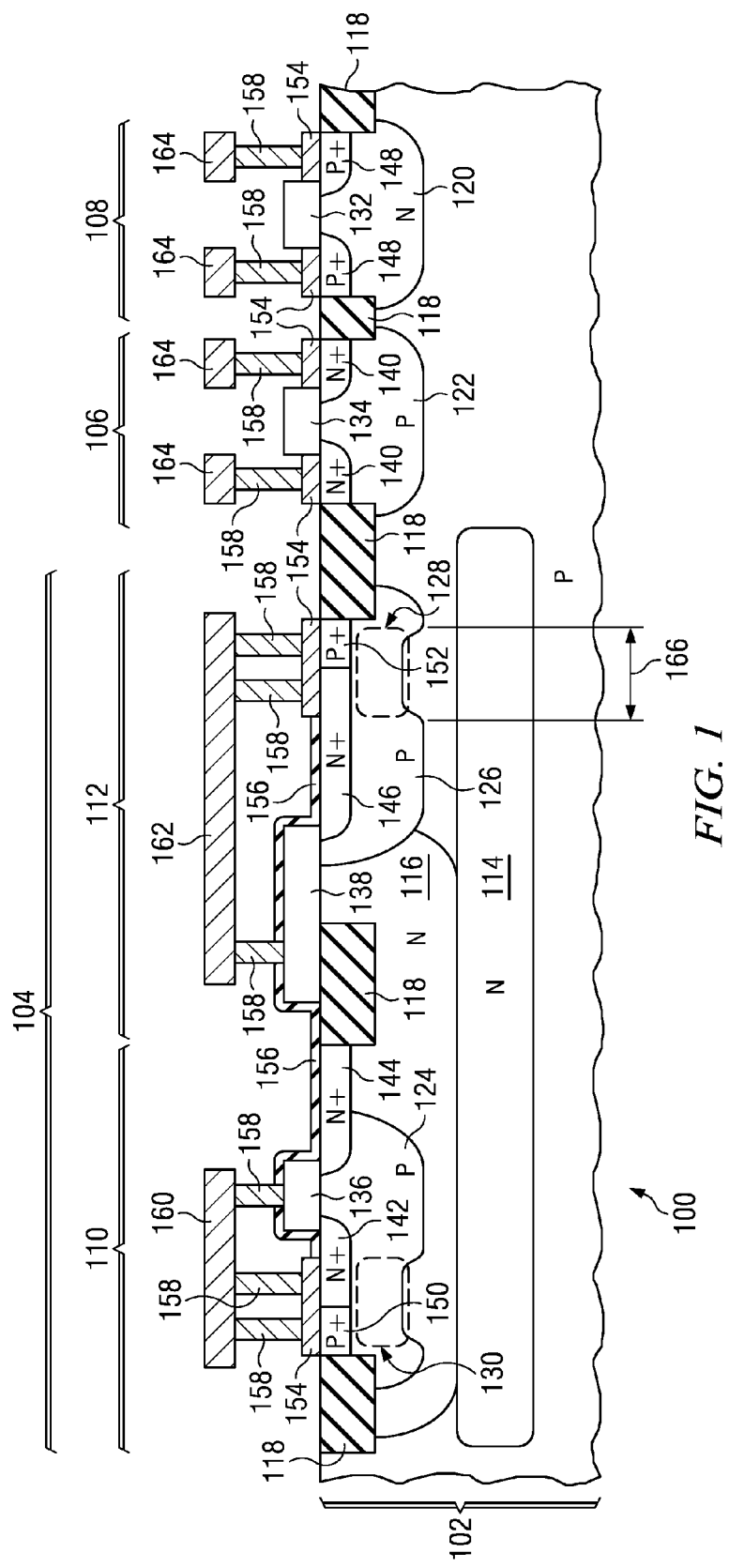
FIG. 1 is a cross section of an integrated circuit containing a bidirectional NMOS SCR according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include an NMOS SCR in which a p-type body well of the NMOS transistor provides a p-type layer for an SCR, functioning as a base layer in an NPN bipolar transistor of the SCR. The p-type body well is formed by implanting p-type dopants using an implant mask which has a cutout segment, so as to block the p-type dopants from a cutout in the p-type body well under an n-type source region and a p-type body contact region. The p-type body well is implanted concurrently with p-type body wells under NMOS transistors in logic components in the integrated circuit. Subsequent anneals cause the p-type dopants to diffuse into the cutout, forming a cutout with a lower doping density than regions of the body well outside the cutout, providing a higher gain NPN bipolar transistor of the SCR, thus providing a reduced holding voltage. The NMOS transistor in the NMOS SCR may be a symmetric transistor, or may be a drain extended transistor. A bidirectional NMOS SCR may be formed which includes two integrated NMOS SCRs, for example a symmetric transistor integrated with a drain extended transistor. A symmetric transistor has substantially equal and symmetric source and drain regions. Symmetric transistors are commonly used in logic circuits. Drain extended transistors have lightly doped drain regions adjacent to gates of the drain extended transistors and drain contacts which are separated from the gates, as compared to source regions and source contacts of the drain extended transistors.

FIG. 1 is a cross section of an integrated circuit containing a bidirectional NMOS SCR according to an embodiment. The integrated circuit 100 is formed in and on a semiconductor substrate 102, which may be, for example, a single crystal silicon wafer, a silicon-on-insulator (SOI) wafer, a hybrid orientation technology (HOT) wafer with regions of different crystal orientations, or other material appropriate for fabrication of the integrated circuit 100. The substrate 102 has a p-type conductivity, for example, 3 to 30 ohm-cm, at a top surface. The integrated circuit 100 includes an area defined for the bidirectional NMOS SCR 104, an area defined for a symmetric NMOS transistor 106 and an area defined for a symmetric p-channel metal oxide semiconductor (PMOS) transistor 108. The area for the bidirectional NMOS SCR 104 further includes an area for a symmetric transistor 110 and an area for a drain extended transistor 112. The NMOS transistor 106 and the PMOS transistor 108 may be part of a CMOS logic component, such as a CMOS inverter, a CMOS NAND gate or a CMOS NOR gate. The NMOS transistor 106 and the PMOS transistor 108 may operate, for example, at 5 volts, or 3.3 volts, or 2.5 volts, or may operate at a voltage typical of core logic circuits in a digital integrated circuit, for example 1.2 volts or 1.5 volts.

An n-type buried layer 114 is disposed in the substrate 102 in the area for the bidirectional NMOS SCR 104, for example, 2 to 4 microns below the top surface of the substrate 102. The n-type buried layer 114 may have an average doping density of, for example, $3 \times 10^{18}$ cm$^{-3}$ to $3 \times 10^{19}$ cm$^{-3}$ and be, for example, 2 to 4 microns thick. A deep n-type well 116 is disposed in the substrate 102 in a portion of the area of the bidirectional NMOS SCR 104 in the area for the symmetric transistor 110 and extending laterally into the area for the drain extended transistor 112, and extending from the n-type buried layer 114 to the top surface of the substrate 102. The deep n-type well 116 may have an average doping density of, for example, $1 \times 10^{16}$ cm$^{-3}$ to $4 \times 10^{16}$ cm$^{-3}$.

Elements of field oxide 118 are disposed at the top surface of the substrate 102, for example, of silicon dioxide between 250 and 600 nanometers thick, laterally separating the area for the bidirectional NMOS SCR 104, the area for the symmetric NMOS transistor 106 and the area for the symmetric PMOS transistor 108, and further separating the area for the symmetric transistor 110 and the area for the drain extended transistor 112.

At least one n-type shallow well is disposed in the substrate 102, including a PMOS body well 120 in the area for the symmetric PMOS transistor 108. A plurality of p-type shallow wells are disposed in the substrate 102, including an NMOS body well 122 in the area for the symmetric NMOS transistor 106, a symmetric transistor body well 124 of the symmetric transistor 110 of the bidirectional NMOS SCR 104 and a drain extended body well 126 of the drain extended transistor 112 of the bidirectional NMOS SCR 104. The NMOS body well 122, the symmetric transistor body well 124 and the drain extended body well 126 extend from the top surface of the substrate 102 to a depth of 600 nanometers to 2 microns, for example, and have average doping densities of, for example, $1 \times 10^{18}$ cm$^{-3}$ to $1 \times 10^{19}$ cm$^{-3}$. The drain extended body well 126 has a first cutout 128 with a lower doping density than the drain extended body well 126 outside the first cutout 128. The first cutout 128 forms a base layer for a vertical NPN layer stack of the bidirectional NMOS SCR 104. Optionally, the symmetric transistor body well 124 may have a second cutout 130 similar to the first cutout 128.

A plurality of gate structures, including gate dielectric layers, are formed on and over the substrate 102, including an NMOS gate structure 132 of the symmetric NMOS transistor 106, a PMOS gate structure 134 of the symmetric PMOS transistor 108, a symmetric transistor gate structure 136 of the symmetric transistor 110 of the bidirectional NMOS SCR 104 and a drain extended gate structure 138 of the drain extended transistor 112 of the bidirectional NMOS SCR 104. The gate structures 132, 134, 136 and 138 may include sidewall spacers and top layers of metal silicide.

A plurality of n-type source and drain regions and a plurality of p-type source and drain regions and p-type contact regions are disposed at the top surface of the substrate 102. The n-type source and drain regions include NMOS source/drain regions 140 of the symmetric NMOS transistor 106, a source region 142 and a drain region 144 of the symmetric transistor 110 of the bidirectional NMOS SCR 104 and a source region 146 of the drain extended transistor 112 of the bidirectional NMOS SCR 104. The p-type source and drain regions include PMOS source/drain regions 148 of the symmetric PMOS transistor 108. The p-type contact regions include a body contact region 150 of the symmetric transistor 110 of the bidirectional NMOS SCR 104 and a body contact region 152 of the drain extended transistor 112 of the bidirectional NMOS SCR 104.

The deep n-type well 116 electrically isolates the symmetric transistor 110 of the bidirectional NMOS SCR 104 from the substrate 102 and provides an extended drain of the drain extended transistor 112 of the bidirectional NMOS SCR 104. The deep n-type well 116 directly contacts the drain region 144 of the symmetric transistor 110 of the bidirectional NMOS SCR 104.

Metal silicide 154 may be formed at the top surface of the substrate 102 on the source region 142 and body contact region 150 of the symmetric transistor 110 of the bidirectional NMOS SCR 104 to improve electrical connection to the symmetric transistor 110. Similarly, metal silicide 154 may be formed at the top surface of the substrate 102 on a portion of the source region 146 and on the body contact region 152 of the drain extended transistor 112 of the bidirectional NMOS SCR 104 to improve electrical connection to the drain extended transistor 112. Metal silicide 154 may also be formed at the top surface of the substrate 102 on the NMOS source/drain regions 140 of the symmetric NMOS transistor 106 and the PMOS source/drain regions 148 of the symmetric PMOS transistor 108. A dielectric silicide block layer 156 may be used to block metal silicide from over the drain region 144 of the symmetric transistor 110 of the bidirectional NMOS SCR 104 and from a portion of the source region 146 adjacent to the drain extended gate structure 138, to advantageously reduce current filamentation and thereby improve reliability of the bidirectional NMOS SCR 104.

A plurality of contacts 158 are disposed over the substrate 102 to provide electrical connections to components in the integrated circuit 100. Contacts 158 are electrically coupled to the source region 142, body contact region 150 and the symmetric transistor gate structure 136 of the symmetric transistor 110, to the source region 146, the body contact region 152 and the drain extended gate structure 138 of the drain extended transistor 112, to the NMOS source/drain regions 140 of the symmetric NMOS transistor 106, and to the PMOS source/drain regions 148 of the symmetric PMOS transistor 108, possibly through the metal silicide 154, if present.

A plurality of metal interconnects are disposed over the substrate 102 to provide electrical connections to components in the integrated circuit 100, through the contacts 158. In one version of the instant embodiment, a first interconnect 160 connects to the source region 142, body contact region 150 and the symmetric transistor gate structure 136 of the symmetric transistor 110, and a second interconnect 162 connects to the source region 146, the body contact region 152 and the drain extended gate structure 138 of the drain extended transistor 112, as depicted in FIG. 1. In an alternate version of the instant embodiment, the symmetric transistor gate structure 136 may be electrically coupled to the source region 142 of the symmetric transistor 110 through a resistor. In a further version, the drain extended gate structure 138 may be electrically coupled to the source region 146 of the drain extended transistor 112 through a resistor. Additional interconnects 164 connect to the NMOS source/drain regions 140 of the symmetric NMOS transistor 106, and to the PMOS source/drain regions 148 of the symmetric PMOS transistor 108.

An SCR is formed by a first p-type region which includes the symmetric transistor body well 124, a first n-type region which includes the deep n-type well 116 and the n-type buried layer 114, a second p-type region which includes the drain extended body well 126 and a portion of the substrate 102 under the drain extended body well 126, and a second n-type region which includes the source region 146 of the drain extended transistor 112. During operation of the integrated circuit 100 in which the second interconnect 162 is connected to the substrate 102, a sufficiently high positive voltage applied to the first interconnect 160 will cause breakdown of a pn junction between the first n-type region and the second p-type region, and thereby turn on the SCR. A holding voltage of the SCR is advantageously lower due to reduced doping in the first cutout 128 of the drain extended body well 126 compared to a similar device without a cutout. Inducing current through the n-type buried layer 114 may advantageously provide a higher current capability for the bidirectional NMOS SCR 104 than a comparable device limited to lateral current flow. A width 166 of the first cutout 128 in a direction parallel to current flow through the drain extended transistor 112 may be, for example, 0.5 to 1.5 microns. A p-type doping density of the first cutout 128 may be, for example, between 50 percent and 75 percent of a p-type doping density of the drain extended body well 126 outside of the first cutout 128.

Figure 2A:
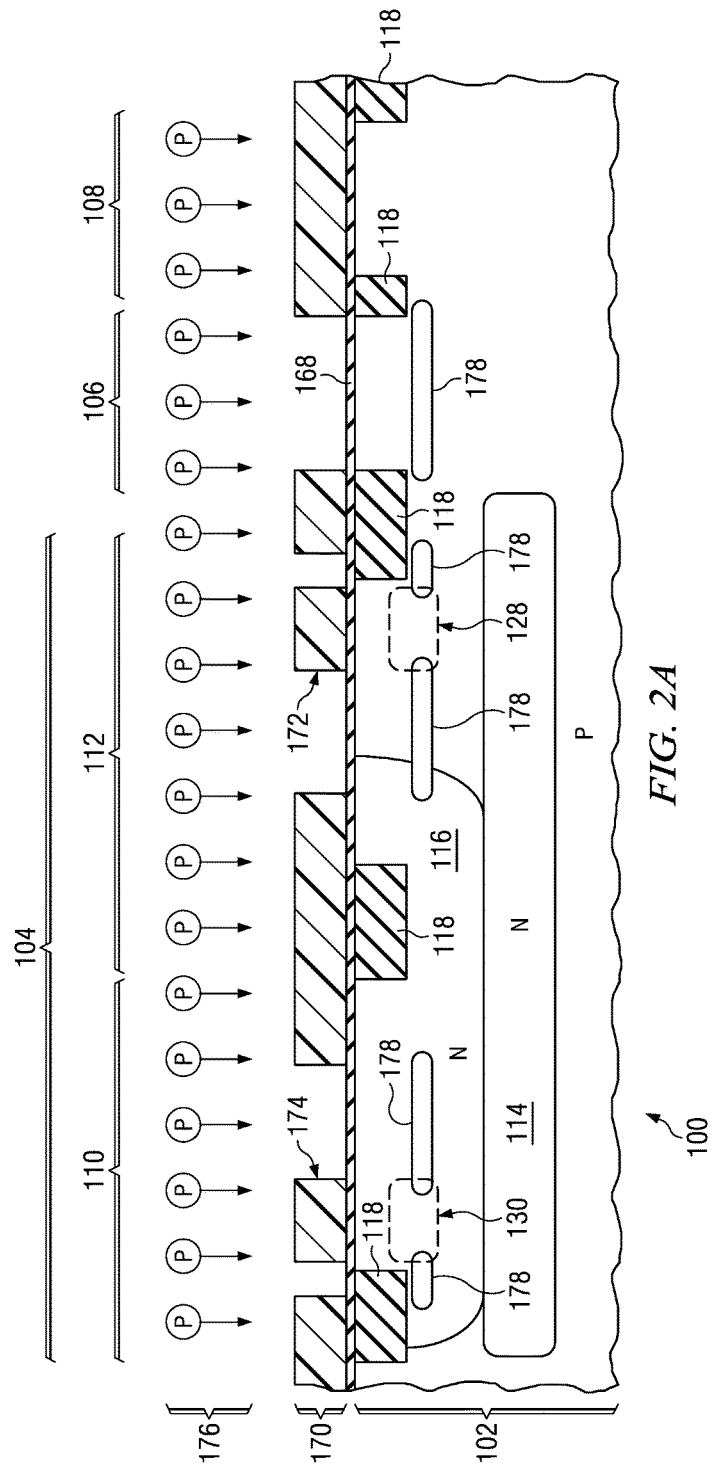
FIG. 2A and FIG. 2B are cross sections of the integrated circuit of FIG. 1, depicted in successive stages of fabrication of the body wells.
Figure 2B:
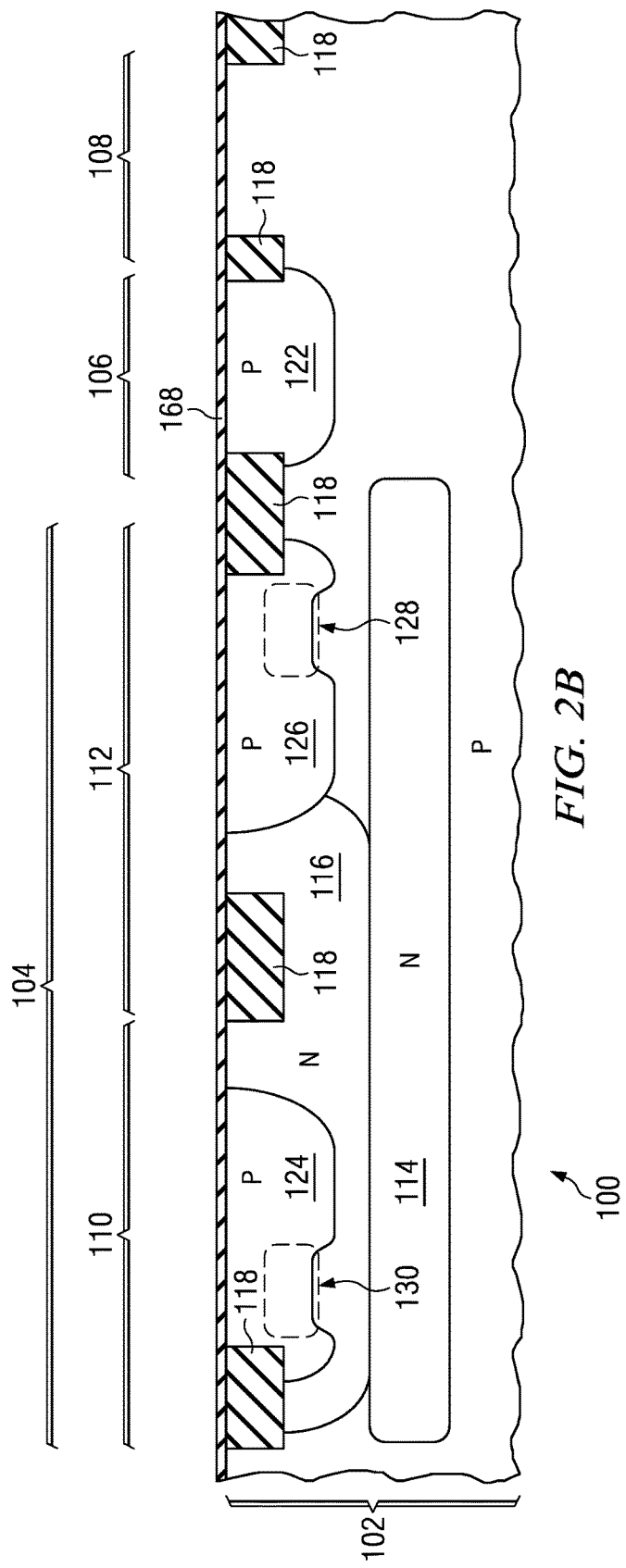

FIG. 2A and FIG. 2B are cross sections of the integrated circuit of FIG. 1, depicted in successive stages of fabrication of the body wells. Referring to FIG. 2A, the integrated circuit 100 has the n-type buried layer 114, the deep n-type well 116 and the field oxide 118 formed in the substrate 102. A layer of silicon dioxide 168, for example 10 to 50 nanometers thick, is formed over the substrate 102, to protect the top surface of the substrate 102 during fabrication steps. A shallow p-type well implant mask 170 is formed over the substrate which exposes areas for implanting p-type dopants for shallow p-type wells. The shallow p-type well implant mask 170 may include, for example, photoresist 1.5 to 2.5 microns thick, formed by a photolithographic process. The exposed areas for implanting the p-type dopants include an exposed area for the NMOS body well 122, the symmetric transistor body well 124 and the drain extended body well 126, of FIG. 1. The shallow p-type well implant mask 170 includes a first cutout segment 172 in the area for the drain extended body well 126 which blocks an area over the first cutout 128. If the second cutout 130 is to be formed, then the shallow p-type well implant mask 170 includes a second cutout segment 174 in the area for the symmetric transistor body well 124 which blocks an area over the second cutout 130. A shallow p-type well ion implant process is performed which implants p-type dopants 176 such as boron into the substrate 102 in the areas exposed by the shallow p-type well implant mask 170 to form shallow p-type well implanted regions 178 in the substrate 102 under the areas exposed by the shallow p-type well implant mask 170. The shallow p-type well ion implant process may implant boron, for example at a dose of $8 \times 10^{13}$ cm$^{-2}$ to $3 \times 10^{14}$ cm$^{-2}$, at an energy of 200 keV to 500 keV. The shallow p-type well implanted regions 178 extend laterally into the first cutout 128, and into the second cutout 130 if the second cutout segment 174 is present, due to lateral straggle of the p-type dopants 176 during the shallow p-type well ion implant process. The lateral straggle may be, for example several hundred nanometers. Additional doses of p-type dopants may be implanted at lower energies during the shallow p-type well ion implant process, for example to provide threshold adjustment and punch-through resistance for NMOS transistors. The p-type dopants 176 of the shallow p-type well ion implant process are blocked from the first cutout 128 by the first cutout segment 172. Similarly, the p-type dopants 176 are blocked from the second cutout 130 by the second cutout segment 174. The shallow p-type well implant mask 170 is removed after the shallow p-type well ion implant process is performed.

Referring to FIG. 2B, an anneal operation is performed which diffuses and activates the p-type dopants in the shallow p-type well implanted regions 178 of FIG. 2A to form the NMOS body well 122 in the area for the symmetric NMOS transistor 106, the symmetric transistor body well 124 of the symmetric transistor 110 of the bidirectional NMOS SCR 104 and the drain extended body well 126 of the drain extended transistor 112 of the bidirectional NMOS SCR 104. The anneal operation may be, for example, in a rapid thermal processor (RTP) at 1050° C. for 30 seconds or equivalent anneal conditions, for example, 1075° C. for 15 seconds, or 1000° C. for 100 seconds. The p-type dopants 176 in the shallow p-type well implanted regions 178 diffuse further into the first cutout 128, and into the second cutout 130 if formed. Lateral dimensions of the first cutout segment 172 may be adjusted to provide a desired doping density in the first cutout 128, and similarly for the second cutout segment 174 and second cutout 130, respectively. An average p-type doping density of the NMOS body well 122 is substantially equal to an average p-type doping density of the symmetric transistor body well 124, not including the second cutout 130, and is substantially equal to an average p-type doping density of the drain extended body well 126, not including the first cutout 128. Subsequently, processing steps are performed to form the integrated circuit 100 of FIG. 1.

Figure 3:
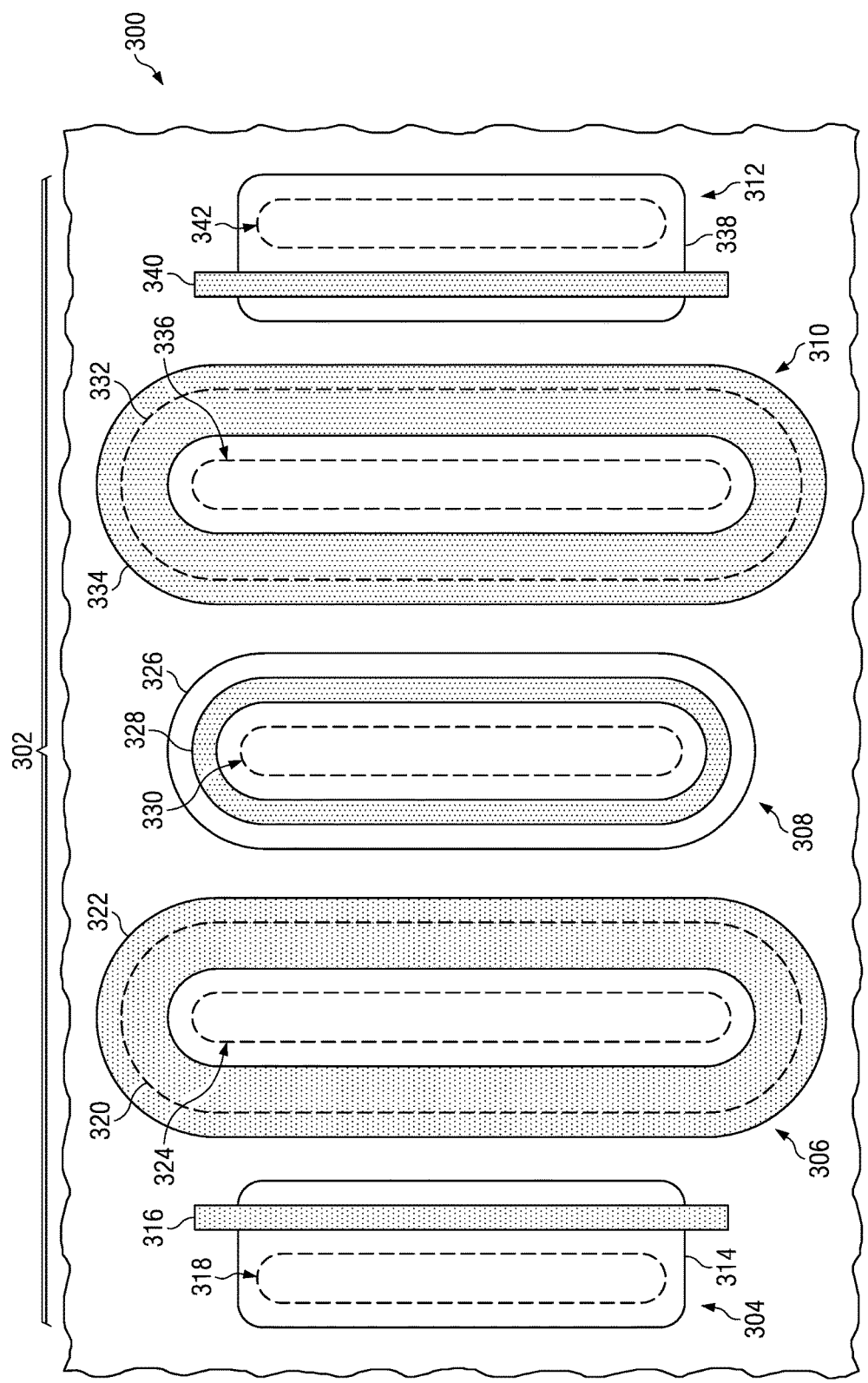
FIG. 3 is a top view of an integrated circuit containing a bidirectional NMOS SCR with an exemplary layout.

FIG. 3 is a top view of an integrated circuit containing a bidirectional NMOS SCR with an exemplary layout. Field oxide is not depicted in FIG. 3 so as to more clearly show the body wells and cutouts. The integrated circuit 300 includes the bidirectional NMOS SCR 302 which may be formed according to the process sequence described in reference to FIG. 2A and FIG. 2B. The bidirectional NMOS SCR 302 includes a first transistor portion 304 having a linear symmetric configuration, a second transistor portion 306 having a closed loop drain extended configuration disposed adjacent to the first transistor portion 304, a third transistor portion 308 having a closed loop symmetric configuration disposed adjacent to the second transistor portion 306 and opposite from the first transistor portion 304, a fourth transistor portion 310 having a closed loop drain extended configuration disposed adjacent to the third transistor portion 308 and opposite from the second transistor portion 306, and a fifth transistor portion 312 having a linear symmetric configuration disposed adjacent to the fourth transistor portion 310 and opposite from the third transistor portion 308. Long axes of the first transistor portion 304, the second transistor portion 306, the third transistor portion 308, the fourth transistor portion 310 and the fifth transistor portion 312 are aligned parallel to each other.

The first transistor portion 304 has a first body well 314 having a linear configuration. The first transistor portion 304 also has a first gate 316 having a linear configuration aligned with the first body well 314, disposed adjacent to the second transistor portion 306. The first gate 316 is depicted with a stipple fill pattern to more clearly show its layout with respect to the first body well 314. The first body well 314 has a first cutout 318 having a linear configuration aligned with the first body well 314 and the first gate 316, and disposed adjacent to the first gate 316 and opposite from the second transistor portion 306.

The second transistor portion 306 has a second body well 320 having a linear bilateral configuration with a first channel area adjacent to the first transistor portion 304 and a second channel area adjacent to the third transistor portion 308. The second transistor portion 306 also has a second gate 322 having a closed loop configuration aligned with the second body well 320, so that one leg of the closed loop covers the first channel area adjacent to the first transistor portion 304 and a second leg of the closed loop covers the second channel area adjacent to the third transistor portion 308. The second gate 322 is depicted with a stipple fill pattern to more clearly show its layout with respect to the second body well 320. The second body well 320 has a second cutout 324 having a linear configuration aligned with the second body well 320 disposed between the first leg and the second leg of the second gate 322. The second gate 322 may extend past the second body well 320 on all sides, as depicted in FIG. 3, consistent with a drain extended transistor configuration.

The third transistor portion 308 has a third body well 326 having a linear bilateral configuration with a first channel area adjacent to the second transistor portion 306 and a second channel area adjacent to the fourth transistor portion 310. The third transistor portion 308 also has a third gate 328 having a closed loop configuration aligned with the third body well 326, so that one leg of the closed loop covers the first channel area adjacent to the second transistor portion 306 and a second leg of the closed loop covers the second channel area adjacent to the fourth transistor portion 310. The third gate 328 is depicted with a stipple fill pattern to more clearly show its layout with respect to the third body well 326. The third body well 326 has a third cutout 330 having a linear configuration aligned with the third body well 326 disposed between the first leg and the second leg of the third gate 328. The third body well 326 extends past the third gate 328 on all sides, consistent with a symmetric transistor configuration.

The fourth transistor portion 310 has a fourth body well 332, a fourth gate 334 and a fourth cutout 336, configured similarly to the second transistor portion 306. The fifth transistor portion 312 has a fifth body well 338, a fifth gate 340 and a fifth cutout 342, configured similarly to the first transistor portion 304. Configuring the bidirectional NMOS SCR 302 as depicted in FIG. 3 may advantageously provide a higher current density compared to a bidirectional NMOS SCR with a linear configuration.

Figure 4:
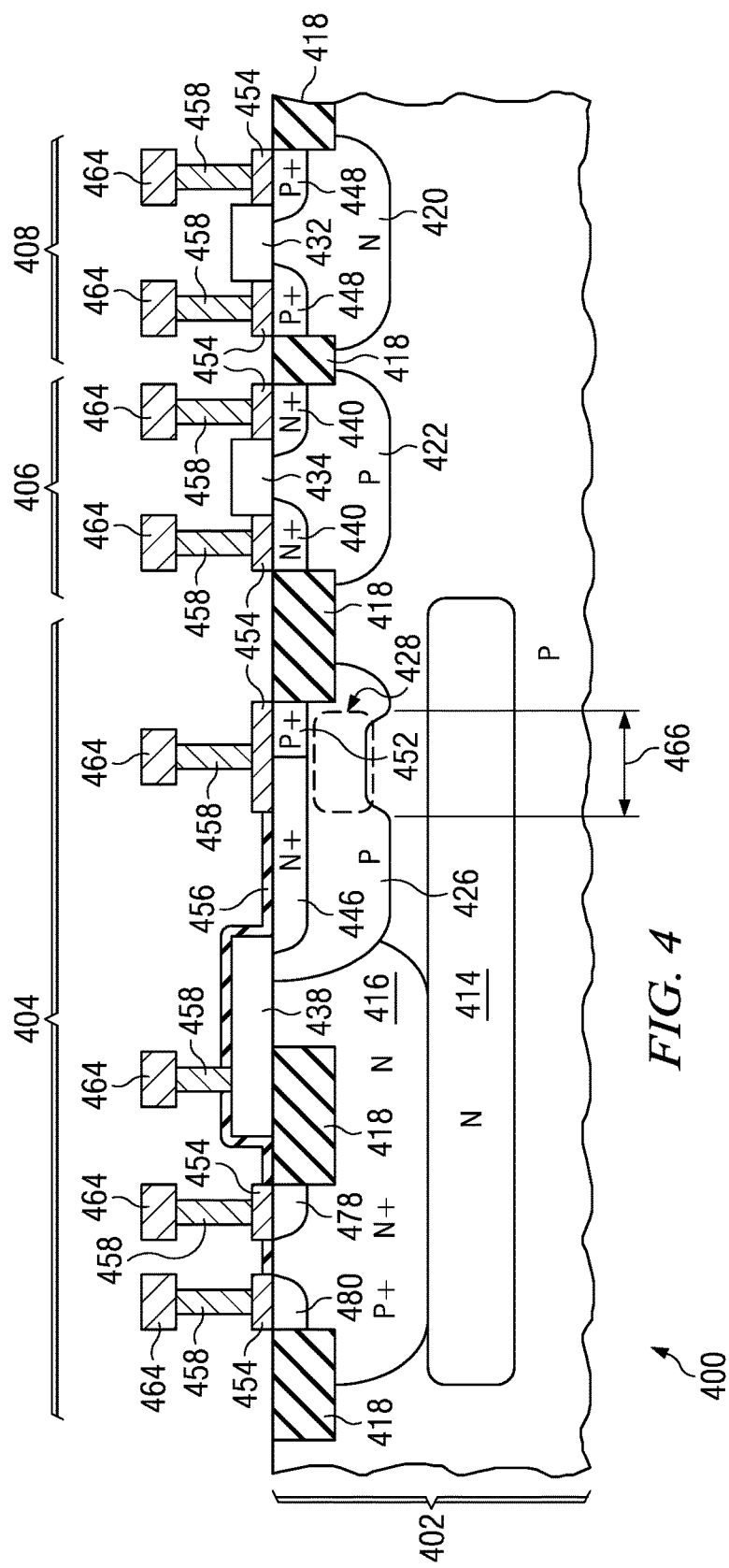
FIG. 4 is a cross section of an integrated circuit containing a drain extended NMOS SCR.

FIG. 4 is a cross section of an integrated circuit containing a drain extended NMOS SCR. The integrated circuit 400 is formed in and on a semiconductor substrate 402, as described in reference to FIG. 1, having a p-type conductivity at a top surface. The integrated circuit 400 includes an area defined for the drain extended NMOS SCR 404, an area defined for a symmetric NMOS transistor 406 and an area defined for a symmetric p-channel metal oxide semiconductor (PMOS) transistor 408. The NMOS transistor 406 and the PMOS transistor 408 are as described in reference to FIG. 1.

An optional n-type buried layer 414 as described in reference to FIG. 1 is disposed in the substrate 402 in the area of the drain extended NMOS SCR 404. A deep n-type well 416 is disposed in the substrate 402 in the area of the drain extended NMOS SCR 404 extending from the n-type buried layer 414 to the top surface of the substrate 402. The deep n-type well 416 provides an extended drain region for the drain extended NMOS SCR 404, and has the properties described in reference to FIG. 1. Elements of field oxide 418 are disposed at the top surface of the substrate 402, laterally separating the area for the drain extended NMOS SCR 404, the area for the symmetric NMOS transistor 406 and the area for the symmetric PMOS transistor 408.

At least one n-type shallow well is disposed in the substrate 402, including a PMOS body well 420 in the area for the symmetric PMOS transistor 408. A plurality of p-type shallow wells are disposed in the substrate 402, including an NMOS body well 422 in the area for the symmetric NMOS transistor 406, and a drain extended body well 426 of the drain extended NMOS SCR 404. The NMOS body well 422 and the drain extended body well 426 have the properties described in reference to FIG. 1. The drain extended body well 426 has a cutout 428 with a lower doping density than the drain extended body well 426 outside the cutout 428. The cutout 428 forms a base layer for a vertical NPN layer stack of the drain extended NMOS SCR 404.

A plurality of gate structures, including gate dielectric layers, are formed on and over the substrate 402, including an NMOS gate structure 432 of the symmetric NMOS transistor 406, a PMOS gate structure 434 of the symmetric PMOS transistor 408 and a drain extended gate structure 438 of the drain extended NMOS SCR 404. The gate structures 432, 434 and 438 may include sidewall spacers and top layers of metal silicide.

A plurality of n-type source and drain regions and a plurality of p-type source and drain regions and p-type contact regions are disposed at the top surface of the substrate 402. The n-type source and drain regions include NMOS source/drain regions 440 of the symmetric NMOS transistor 406, and a drain contact region 478 and a source region 446 of the drain extended NMOS SCR 404. The p-type source and drain regions include PMOS source/drain regions 448 of the symmetric PMOS transistor 408. The p-type contact regions include a body contact region 452 of the drain extended NMOS SCR 404 and an SCR contact region 480 in the deep n-type well 416 adjacent to the drain contact region 478.

Metal silicide 454 may be formed at the top surface of the substrate 402 as described in reference to FIG. 1 A dielectric silicide block layer 456 may be used to block metal silicide from a portion of the source region 446 adjacent to the drain extended gate structure 438, to improve a breakdown voltage of the drain extended NMOS SCR 404. A plurality of contacts 458 are disposed over the substrate 402 to provide electrical connections to components in the integrated circuit 400 as described in reference to FIG. 1. A plurality of metal interconnects 464 are disposed over the substrate 402 to provide electrical connections to components in the integrated circuit 400, through the contacts 458. Connections to the SCR contact region 480 and/or the drain contact region 478 may be direct electrical connections or may be through resistors to provide a voltage offset. Similarly, connections to the drain extended gate structure 438 and/or the drain contact region 478 may be direct electrical connections or may be through resistors.

An SCR is formed by a first p-type region including the SCR contact region 480, a first n-type region including the deep n-type well 416 and the n-type buried layer 414 if present, a second p-type region including the drain extended body well 426 and a portion of the substrate 402 under the drain extended body well 426, and a second n-type region including the source region 446 of the drain extended NMOS SCR 404. During operation of the integrated circuit 400 in which the second interconnect 462 is connected to the substrate 402, a sufficiently high positive voltage applied to the SCR contact region 480 will cause breakdown of a pn junction between the first n-type region and the second p-type region, and thereby turn on the SCR. A holding voltage of the SCR is advantageously lower due to reduced doping in the cutout 428 of the drain extended body well 426 compared to a similar device without a cutout. Inducing current through the n-type buried layer 414, if present, may advantageously provide a higher current capability for the drain extended NMOS SCR 404 than a comparable device limited to lateral current flow. A width 466 of the cutout 428 in a direction parallel to current flow through the drain extended NMOS SCR 404 may be, for example, 0.5 to 1.5 microns. A p-type doping density of the cutout 428 may be, for example, between 50 percent and 75 percent of a p-type doping density of the drain extended body well 426 outside of the cutout 428. The drain extended configuration of the drain extended NMOS SCR 404 may advantageously provide a higher operating voltage than a comparable device with a non-extended drain configuration.

Figure 5:
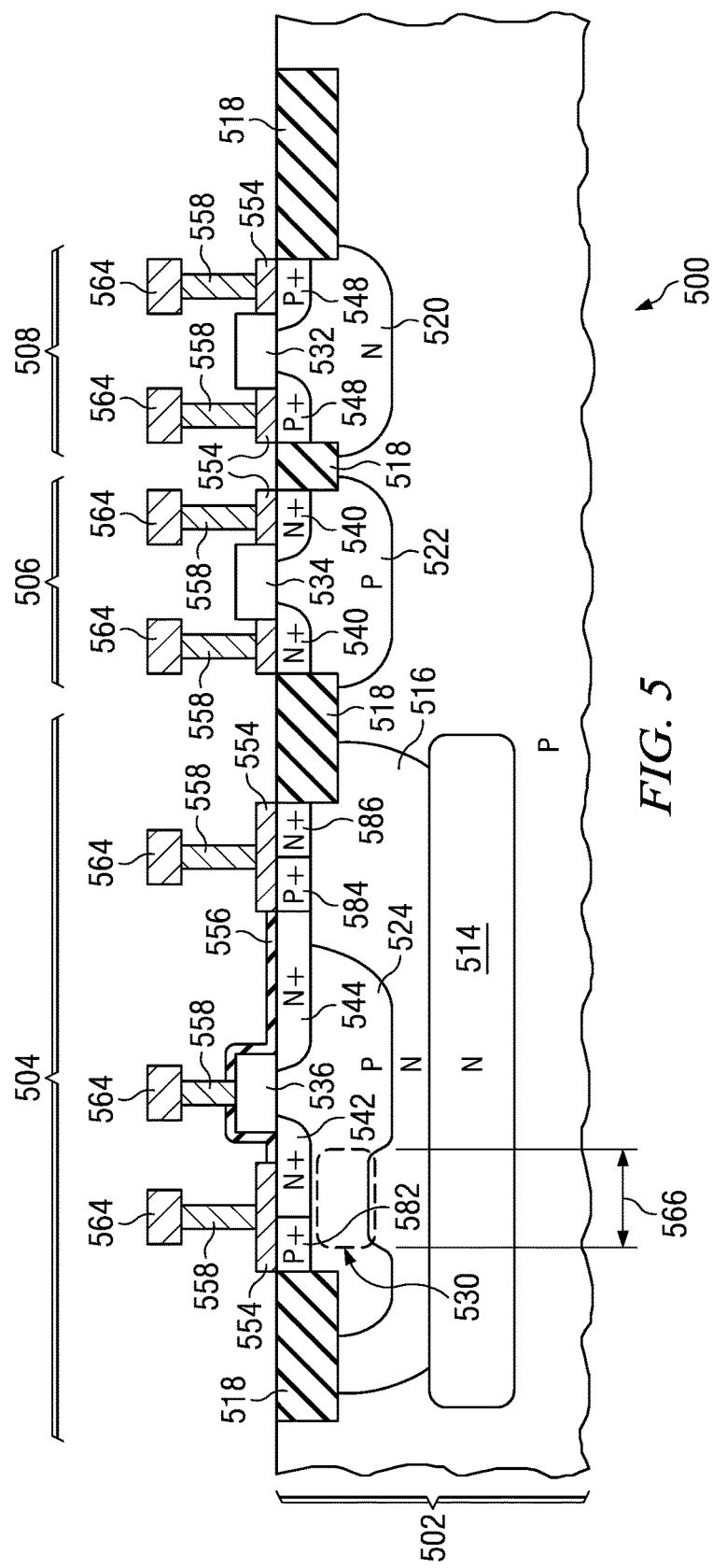
FIG. 5 is a cross section of an integrated circuit containing a symmetric NMOS SCR.

FIG. 5 is a cross section of an integrated circuit containing a symmetric NMOS SCR. The integrated circuit 500 is formed in and on a semiconductor substrate 502, as described in reference to FIG. 1, having a p-type conductivity at a top surface. The integrated circuit 500 includes an area defined for the symmetric NMOS SCR 504, an area defined for a symmetric NMOS transistor 506 and an area defined for a symmetric PMOS transistor 508. The NMOS transistor 506 and the PMOS transistor 508 are as described in reference to FIG. 1.

An optional n-type buried layer 514 as described in reference to FIG. 1 is disposed in the substrate 502 in the area of the symmetric NMOS SCR 504. Elements of field oxide 518 are disposed at the top surface of the substrate 502, laterally separating the area for the symmetric NMOS SCR 504, the area for the symmetric NMOS transistor 506 and the area for the symmetric PMOS transistor 508. A deep n-type well 516 is disposed in the substrate 502 in the area of the symmetric NMOS SCR 504 extending from the n-type buried layer 514 to the field oxide 518. The deep n-type well 516 has the properties described in reference to FIG. 1.

At least one optional n-type shallow well may be disposed in the substrate 502, including a PMOS body well 520 in the area for the symmetric PMOS transistor 508. A plurality of p-type shallow wells are disposed in the substrate 502, including an NMOS body well 522 in the area for the symmetric NMOS transistor 506, and an isolated body well 524 of the symmetric NMOS SCR 504. The isolated body well 524 is electrically isolated from the substrate 502 by a combination of the n-type buried layer 514, the deep n-type well 516 and the field oxide 518. The NMOS body well 522 and the isolated body well 524 have the properties described in reference to FIG. 1. The isolated body well 524 has a cutout 530 with a lower doping density than the isolated body well 524 outside the cutout 530. The cutout 530 forms a base layer for a vertical NPN layer stack of the symmetric NMOS SCR 504.

A plurality of gate structures, including gate dielectric layers, are formed on and over the substrate 502, including an NMOS gate structure 532 of the symmetric NMOS transistor 506, a PMOS gate structure 534 of the symmetric PMOS transistor 508 and a symmetric gate structure 536 of the symmetric NMOS SCR 504. The gate structures 532, 534 and 536 may include sidewall spacers and top layers of metal silicide.

A plurality of n-type source and drain regions and n-type contact regions and a plurality of p-type source and drain regions and p-type contact regions are disposed at the top surface of the substrate 502. The n-type source and drain regions include NMOS source/drain regions 540 of the symmetric NMOS transistor 506, and a drain region 544 and a source region 542 of the symmetric NMOS SCR 504. The source region 542 is disposed over the cutout 530. The drain region 544 overlaps both the isolated body well 524 and the deep n-type well 516. The n-type contact regions include an n-type SCR contact region 586 disposed in the deep n-type well 516 proximate to the drain region 544. The p-type source and drain regions include PMOS source/drain regions 548 of the symmetric PMOS transistor 508. The p-type contact regions include a source-side body contact region 582 of the symmetric NMOS SCR 504 disposed adjacent to the source region 542 and a drain-side body contact region 584 disposed in the deep n-type well 516 between the drain region 544 and the n-type SCR contact region 586.

Metal silicide 554 may be formed at the top surface of the substrate 502 as described in reference to FIG. 1. A dielectric silicide block layer 556 may be used to block metal silicide from at least portion of the drain region 544 and a portion of the source region 542 adjacent to the symmetric gate structure 536, to reduce current filamentation in the symmetric NMOS SCR 504. A plurality of contacts 558 are disposed over the substrate 502 to provide electrical connections to components in the integrated circuit 500 as described in reference to FIG. 1. A plurality of metal interconnects 564 are disposed over the substrate 502 to provide electrical connections to components in the integrated circuit 500, through the contacts 558. Connections to the n-type SCR contact region 586 and the drain-side body contact region 584 on the drain side of the symmetric NMOS SCR 504 and to the source region 542 and the source-side body contact region 582 on the source side of the symmetric NMOS SCR 504 may be direct electrical connections or may be through resistors to provide a voltage offset.

An SCR is formed by a first p-type region including the source-side body contact region 582 and the isolated body well 524, a first n-type region including the deep n-type well 516, the drain region 544 and the n-type buried layer 514 if present, a second p-type layer including the drain-side body contact region 584 and a second n-type layer including the n-type SCR contact region 586. A holding voltage of the SCR is advantageously lower due to reduced doping in the cutout 530 of the isolated body well 524 compared to a similar device without a cutout. A width 566 of the cutout 530 in a direction parallel to current flow through the symmetric NMOS SCR 504 may be, for example, 0.5 to 1.5 microns. A p-type doping density of the cutout 530 may be, for example, between 50 percent and 75 percent of a p-type doping density of the isolated body well 524 outside of the cutout 530. The symmetric configuration of the symmetric NMOS SCR 504 may advantageously provide a reduced area compared to an extended drain configuration.

FIG. 6A through FIG. 6C are top views of integrated circuits depicting successive stages of formation of a cutout in a body well. Referring to FIG. 6A, a shallow p-type well implant mask 668 is formed over a substrate 602 of the integrated circuit 600. The shallow p-type well implant mask 668 exposes an area 686 for a body well. The shallow p-type well implant mask 668 includes a plurality of closely spaced cutout segments 670 over an area for a cutout in the body well. Lateral dimensions of the cutout segments 670 and distances between adjacent cutout segments 670 are less than diffusion lengths of dopants implanted into the substrate 602 to form the body well after subsequent anneals. A shallow p-type well ion implant process is performed which implants p-type dopants such as boron into the substrate 602 in the exposed area 686, as described in reference to FIG. 2A. The shallow p-type well implant mask 668 is removed after the shallow p-type well ion implant process is completed.

Referring to FIG. 6B, an anneal operation is performed as described in reference to FIG. 2B which diffuses and activates the p-type dopants in the substrate 602 from the shallow p-type well ion implant process, to form the body well 624 with a cutout 628. Forming the cutout 628 using the closely spaced cutout segments 670 may advantageously provided a desired doping density in the cutout 628.

Referring to FIG. 6C, a p-type body contact region 650 is formed in the substrate 602 over the cutout 628. An n-type source region 642 is formed in the substrate 602 adjacent to the p-type body contact region 650 and overlapping the cutout 628. The configuration depicted in FIG. 6C may advantageously provide a desired high current density through the cutout 628.

Figure 7C:
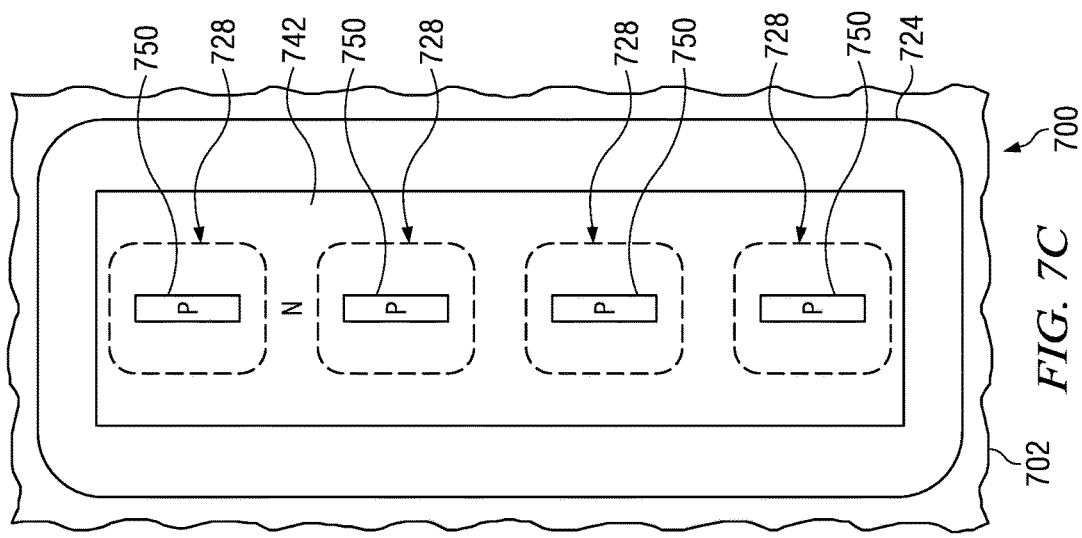
FIG. 7A through FIG. 7C are top views of integrated circuits depicting successive stages of formation of a cutout in a body well.
Figure 7B:
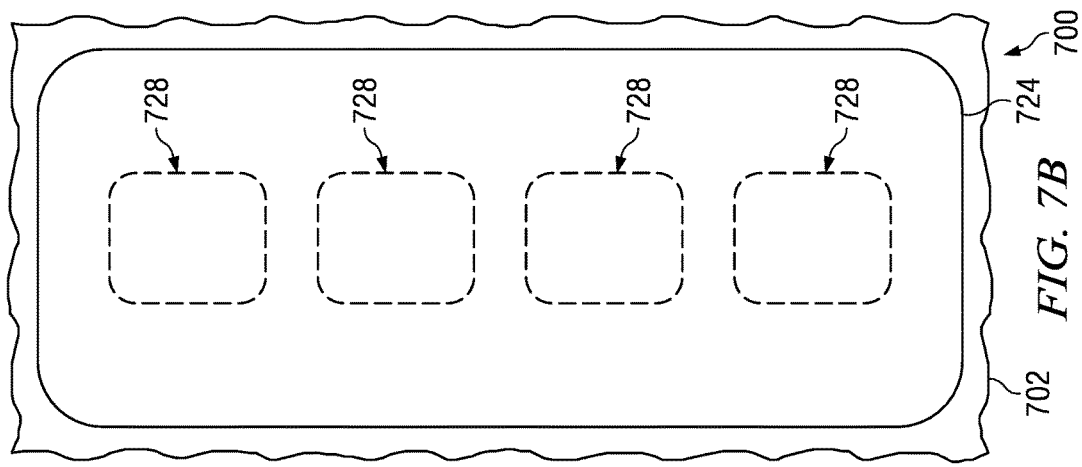
Figure 7A:
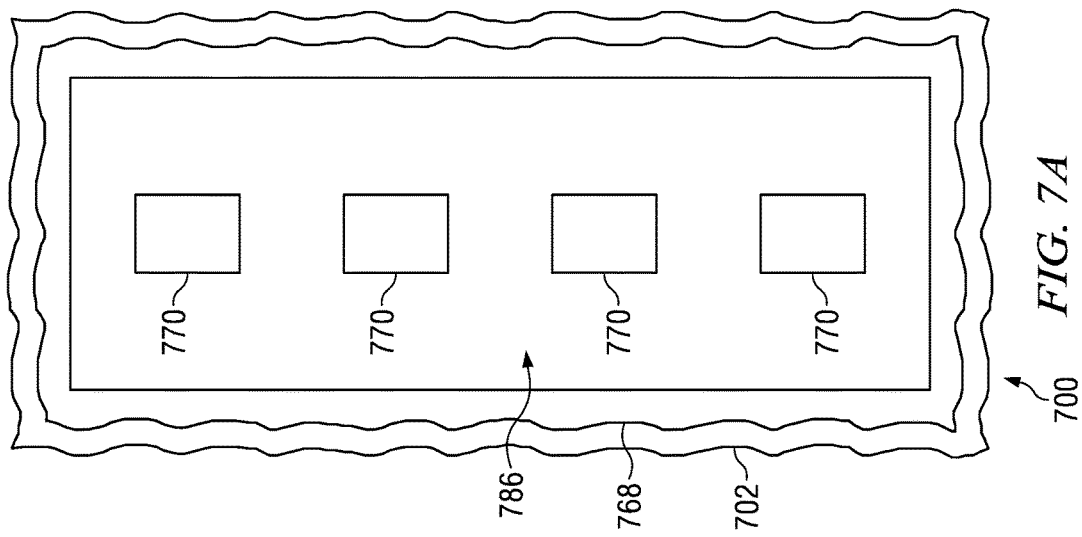

FIG. 7A through FIG. 7C are top views of integrated circuits depicting successive stages of formation of a cutout in a body well. Referring to FIG. 7A, a shallow p-type well implant mask 768 is formed over a substrate 702 of the integrated circuit 700. The shallow p-type well implant mask 768 exposes an area 786 for a body well. The shallow p-type well implant mask 768 includes a plurality of cutout segments 770 over respective areas for a plurality of cutout portions in the body well. Distances between adjacent cutout segments 770 are equivalent to or greater than diffusion lengths of dopants implanted into the substrate 702 to form the body well after subsequent anneals. A shallow p-type well ion implant process is performed which implants p-type dopants such as boron into the substrate 702 in the exposed area 786, as described in reference to FIG. 2A. The shallow p-type well implant mask 768 is removed after the shallow p-type well ion implant process is completed.

Referring to FIG. 7B, an anneal operation is performed as described in reference to FIG. 2B which diffuses and activates the p-type dopants in the substrate 702 from the shallow p-type well ion implant process, to form the body well 724 with the plurality of cutout portions 728. The cutout portions 728 form a cutout in the body well 724.

Referring to FIG. 7C, a plurality of p-type body contact regions 750 is formed in the substrate 702 over the cutout portions 728. An n-type source region 742 is formed in the substrate 702 adjacent to the p-type body contact region 750 and overlapping the cutout portions 728. The configuration depicted in FIG. 7C may advantageously provide a desired balanced current through the cutout portions 728.

Figure 8C:
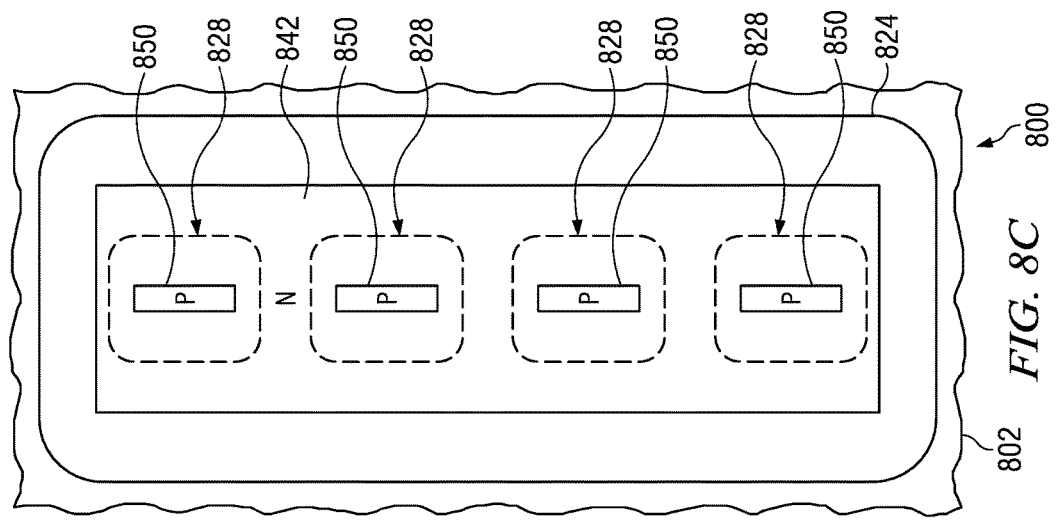
FIG. 8A through FIG. 8C are top views of integrated circuits depicting successive stages of formation of a cutout in a body well.
Figure 8B:
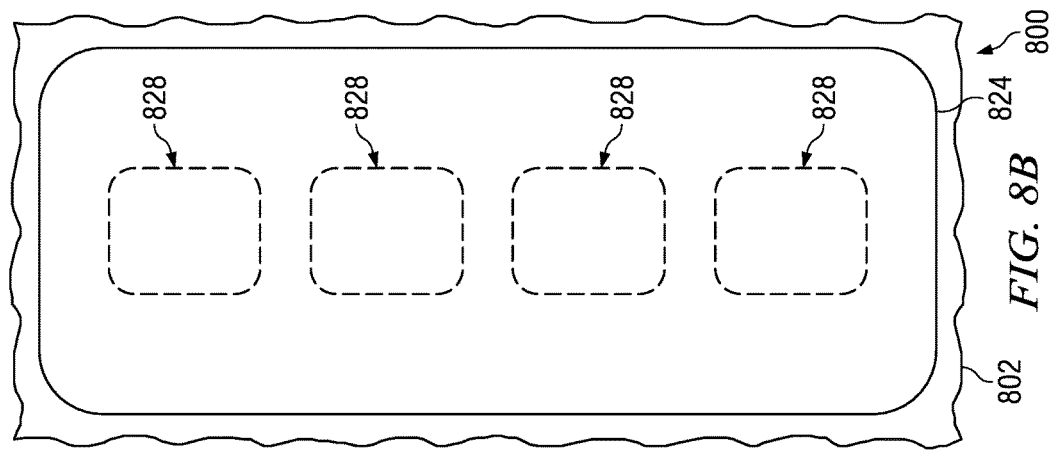
Figure 8A:
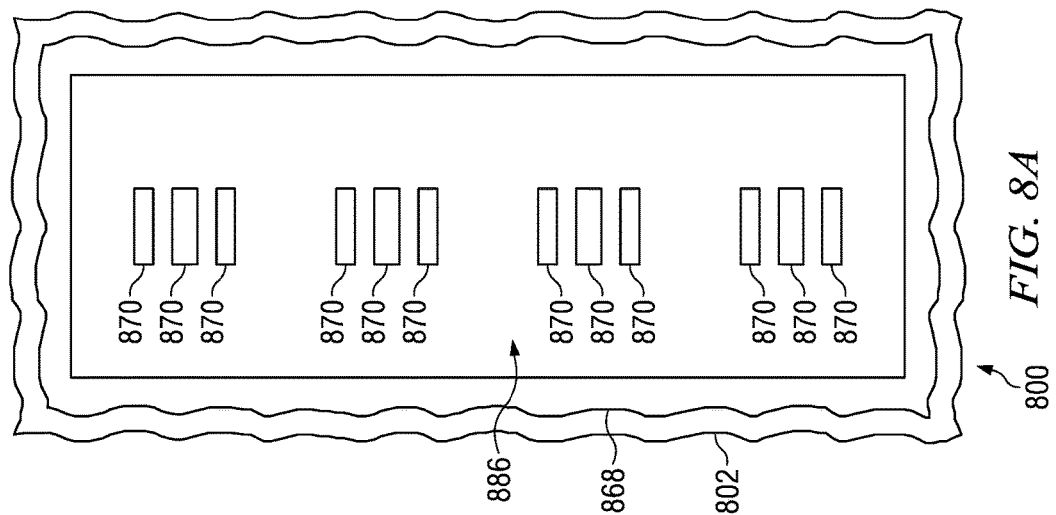

FIG. 8A through FIG. 8C are top views of integrated circuits depicting successive stages of formation of a cutout in a body well. Referring to FIG. 8A, a shallow p-type well implant mask 868 is formed over a substrate 802 of the integrated circuit 800. The shallow p-type well implant mask 868 exposes an area 886 for a body well. The shallow p-type well implant mask 868 includes a plurality of cutout segments 870 over respective areas for a plurality of cutout portions in the body well. There is more than one cutout segment 870 over each cutout portion area. Lateral dimensions of the cutout segments 870 and distances between adjacent cutout segments 870 in a single cutout portion area are less than diffusion lengths of dopants implanted into the substrate 802 to form the body well after subsequent anneals. Distances between cutout segments 870 in separate cutout portion area are equivalent to or greater than the diffusion lengths of the dopants. A shallow p-type well ion implant process is performed which implants p-type dopants such as boron into the substrate 802 in the exposed area 886, as described in reference to FIG. 2A. The shallow p-type well implant mask 868 is removed after the shallow p-type well ion implant process is completed.

Referring to FIG. 8B, an anneal operation is performed as described in reference to FIG. 2B which diffuses and activates the p-type dopants in the substrate 802 from the shallow p-type well ion implant process, to form the body well 824 with the plurality of cutout portions 828. The cutout portions 828 form a cutout in the body well 824. Forming the cutout portions 828 using the closely spaced cutout segments 870 may advantageously provided a desired doping density in the cutout portions 828.

Referring to FIG. 8C, a plurality of p-type body contact regions 850 is formed in the substrate 802 over the cutout portions 828. An n-type source region 842 is formed in the substrate 802 adjacent to the p-type body contact region 850 and overlapping the cutout portions 828. The configuration depicted in FIG. 8C may advantageously provide a desired balanced current through the cutout portions 828.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a substrate comprising a p-type semiconductor;
    a symmetric p-channel metal oxide semiconductor (PMOS) transistor disposed in said substrate;
    a p-type n-channel metal oxide semiconductor (NMOS) body well disposed in said substrate;
    a symmetric NMOS transistor disposed in said p-type NMOS body well; and
    an NMOS silicon controlled rectifier (SCR), including:
        a p-type body well disposed in said substrate, said p-type body well having a cutout with a lower doping density;
        an n-type source region disposed in said p-type body well over said cutout;
        an n-type region disposed in said substrate under said cutout, said n-type region being connected to an n-type drain region; and
        a p-type body contact region, disposed in said p-type body well over said cutout;
    wherein said NMOS SCR is a drain extended NMOS SCR, and wherein:

said p-type body well is a p-type drain extended body well;

a deep n-type well is disposed in said substrate, extending laterally to abut said p-type drain extended body well, so that said deep n-type well provides an extended drain of said drain extended transistor; and a p-type SCR contact region is disposed in said deep n-type well.

2. The integrated circuit of claim 1, in which said n-type region disposed under said cutout is an n-type buried layer; so that said deep n-type well contacts a top of said n-type buried layer.

3. An integrated circuit, comprising:

a substrate comprising a p-type semiconductor;

a symmetric p-channel metal oxide semiconductor (PMOS) transistor disposed in said substrate;

a p-type n-channel metal oxide semiconductor (NMOS) body well disposed in said substrate;

a symmetric NMOS transistor disposed in said p-type NMOS body well; and an NMOS silicon controlled rectifier (SCR), including:

a p-type body well disposed in said substrate, said p-type body well having a cutout with a lower doping density;

an n-type source region disposed in said p-type body well over said cutout;

an n-type region disposed in said substrate under said cutout, said n-type region being connected to an n-type drain region; and a p-type body contact region, disposed in said p-type body well over said cutout, in which said NMOS SCR is a symmetric NMOS SCR, wherein:

said p-type body well is an isolated p-type body well;

a deep n-type well is disposed in said substrate, electrically isolating said isolated p-type body well from said substrate; and a p-type SCR contact region is disposed in said deep n-type well.

\* \* \* \* \*